(12) United States Patent
Liu et al.

(10) Patent No.: US 10,665,500 B1
(45) Date of Patent: May 26, 2020

(54) METHODS OF SEMICONDUCTOR DEVICE FABRICATION

(71) Applicant: Yangtze Memory Technologies Co., Ltd., Wuhan (CN)

(72) Inventors: Sha Sha Liu, Wuhan (CN); EnBo Wang, Wuhan (CN); Feng Lu, Wuhan (CN); Li Hong Xiao, Wuhan (CN); Haohao Yang, Wuhan (CN); Zhaosong Li, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/352,539

(22) Filed: Mar. 13, 2019

Related U.S. Application Data

(63) Continuation of application No. PCT/CN2018/119737, filed on Dec. 7, 2018.

(51) Int. Cl.
*H01L 27/11524* (2017.01)
*H01L 21/768* (2006.01)
(Continued)

(52) U.S. Cl.
CPC .... *H01L 21/76831* (2013.01); *H01L 23/5226* (2013.01); *H01L 27/11524* (2013.01); *H01L 27/11556* (2013.01)

(58) Field of Classification Search
CPC ......... H01L 21/76831; H01L 27/11556; H01L 27/11524; H01L 23/5226
See application file for complete search history.

(56) References Cited

U.S. PATENT DOCUMENTS

| 8,470,706 B2 | 6/2013 | Arnold et al. |
| 8,481,423 B2 | 7/2013 | Arnold et al. |

(Continued)

FOREIGN PATENT DOCUMENTS

| CN | 1427749 A | 7/2003 |
| CN | 102569302 A | 7/2012 |

(Continued)

OTHER PUBLICATIONS

Combined Chinese Office Action and Search Report dated Jul. 9, 2019 in Chinese Patent Application No. 201880002774.4 (with English translation of Category of Cited Documents), 6 pages.

(Continued)

*Primary Examiner* — Mohammed R Alam
(74) *Attorney, Agent, or Firm* — Oblon, McClelland, Maier & Neustadt, L.L.P.

(57) ABSTRACT

Aspects of the disclosure provide a method for manufacturing a semiconductor device. A first structure of first stacked insulating layers including a first via over a contact region is formed. A second structure is formed by filling at least a top region of the first via with a sacrificial layer. A third structure including the second structure and second stacked insulating layers stacked above the second structure is formed. The third structure further includes a second via aligned with the first via and extending through the second stacked insulating layers. A fourth structure is formed by removing the sacrificial layer to form an extended via including the first via and the second via. A plurality of weights associated with the first structure, the second structure, the third structure, and the fourth structure is determined, and a quality of the extended via is determined based on the plurality of weights.

20 Claims, 14 Drawing Sheets

(51) Int. Cl.
*H01L 23/522* (2006.01)
*H01L 27/11556* (2017.01)

(56) References Cited

U.S. PATENT DOCUMENTS

| | | | |
|---|---|---|---|
| 9,343,326 | B2 | 5/2016 | Kim et al. |
| 9,728,446 | B2 | 8/2017 | Kang et al. |
| 10,229,927 | B2 | 3/2019 | Lee et al. |
| 2009/0075472 | A1 | 3/2009 | Arnold et al. |
| 2012/0329269 | A1 | 12/2012 | Arnold et al. |
| 2015/0021513 | A1* | 1/2015 | Kim ............ C09K 3/1463 252/79.4 |
| 2015/0166942 | A1 | 6/2015 | Kang et al. |
| 2015/0348798 | A1 | 12/2015 | Kim et al. |
| 2016/0005760 | A1 | 1/2016 | Lee et al. |
| 2016/0071762 | A1 | 3/2016 | Kang et al. |

FOREIGN PATENT DOCUMENTS

| | | |
|---|---|---|
| CN | 102842518 A | 12/2012 |
| CN | 104064487 A | 9/2014 |
| CN | 105244351 A | 1/2016 |
| CN | 105374825 A | 3/2016 |
| CN | 106653684 A | 5/2017 |
| CN | 107978558 A | 5/2018 |

OTHER PUBLICATIONS

International Search Report and Written Opinion of the International Searching Authority dated Sep. 11, 2019, in PCT/CN2018/119737, 11 pages.

Combined Chinese Office Action and Search Report dated Nov. 27, 2019 in Chinese Patent Application No. 201880002774.4 (with English translation of Category of Cited Documents), 6 pages.

* cited by examiner

METHODS OF SEMICONDUCTOR DEVICE FABRICATION

RELATED APPLICATION

This application is a continuation of International Application No. PCT/CN2018/119737, filed on Dec. 7, 2018. The entire disclosure of the prior application is hereby incorporated by reference in its entirety.

BACKGROUND

As critical dimensions of devices in integrated circuits shrink to the limits of common memory cell technologies, techniques are developed to achieve greater storage capacity. Compared to a planar transistor structure, a vertical structure of the 3D NAND memory devices is involved with more complex manufacturing processes. As the 3D NAND memory devices migrates to configurations with more memory cell layers to achieve higher densities at a lower cost per bit, it becomes an increasing challenge to improve structures and methods for manufacturing the same.

SUMMARY

According to aspects of the disclosure, a method for manufacturing a semiconductor device is provided. The method includes forming a first structure of first stacked insulating layers including a first via that is arranged over a contact region on a substrate and that extends through the first stacked insulating layers. The method can also include forming a second structure by filling at least a top region of the first via with a sacrificial layer. Additionally, the method can include forming a third structure including the second structure and second stacked insulating layers that are stacked above the second structure. The third structure further includes a second via that is aligned with the first via and that extends through the second stacked insulating layers. Then a fourth structure can be formed by removing the sacrificial layer from the third structure to form an extended via that includes the first via and the second via. The method can determine a plurality of weights associated with the first structure, the second structure, the third structure, and the fourth structure, and determine a quality of the extended via based on the plurality of weights.

In an embodiment, forming the third structure can include forming a recessed region in the sacrificial layer by removing a top portion from the sacrificial layer. The method can further include obtaining a weight of the removed top portion of the sacrificial layer, and determining the quality of the extended via further based on the plurality of weights and the weight of the removed top portion of the sacrificial layer. In an embodiment, the first recessed region can be formed above the sacrificial layer.

According to aspects of the disclosure, determining the quality of the extended via includes determining whether any of the sacrificial layer remains in the extended via and/or whether any of the contact region was removed. Further, in an example, determining the quality of the extended via includes determining whether any of the substrate was removed.

In alternative embodiments, the plurality of weights can include a first weight, a second weight, a third weight, and a fourth weight corresponding to the first structure, the second structure, the third structure, and the fourth structure, respectively. Determining the quality of the extended via includes determining, based on the first weight and the second weight, a first weight difference corresponding to a weight of the sacrificial layer in the first via. Further, determining the quality of the extended via includes determining, based on the third weight, the fourth weight, and the weight of the removed top portion of the sacrificial layer, a second weight difference corresponding to a sum of a weight of the sacrificial layer removed from the first via and a weight of a portion removed from at least the contact region, and determining the quality of the extended via based on the first weight difference and the second weight difference.

In an embodiment, determining the quality of the extended via includes when the first weight difference and the second weight difference satisfy a pre-defined first condition, the extended via is determined not to include the sacrificial layer and the portion of at least the contact region is not removed. Determining the quality of the extended via includes when the first weight difference and the second weight difference satisfy a pre-defined second condition, the extended via is determined to include a portion of the sacrificial layer. Determining the quality of the extended via includes when the first weight difference and the second weight difference satisfy a pre-defined third condition, the portion of at least the contact region is determined to be removed.

In some embodiments, forming the second structure includes filling at least the top region of the first via with the sacrificial layer where a top surface of the sacrificial layer is coplanar with a top surface of the first structure.

In alternative embodiments, the method can further include forming a fifth structure that includes another sacrificial layer above another semiconductor substrate. The method includes forming other stacked insulating layers over the fifth structure, and the other stacked insulating layers correspond to the second stacked insulating layers. The method includes forming another via extending through the other stacked insulating layers and into the other sacrificial layer by removing a portion of the other stacked insulating layers and a portion of the other sacrificial layer. The method includes removing the other stacked insulating layers to form a sixth structure. The method includes determining a fifth weight of the fifth structure and a sixth weight of the sixth structure, respectively, and determining a weight of the removed portion from the other sacrificial layer based on the fifth weight and the sixth weight.

Further, obtaining the weight of the removed top portion of the sacrificial layer includes obtaining the weight of the removed top portion of the sacrificial layer in the third structure based on the weight of the removed portion from the other sacrificial layer. In an example, the weight of the removed top portion of the sacrificial layer in the third structure is identical to the weight of the removed portion from the other sacrificial layer.

In an example, the first stacked insulating layers include alternately formed first insulating layers and second insulating layers that have different etch rates. In an example, the first insulating layers include silicon oxide and the second insulating layers include silicon nitride.

In an example, the sacrificial layer includes polysilicon. The contact region includes monocrystalline silicon formed by selective epitaxy growth. The first stacked insulating layers in the third structure further include one or more insulating layers between the substrate and a lowermost layer of the first insulating layers and the second insulating layers.

In an embodiment, determining the quality of the extended via includes determining a quality indicator based on the first to fourth weights and the weight of the removed top portion of the sacrificial layer. The quality indicator indicates a difference between a weight of the sacrificial layer in the first via of the second structure and a combined weight that is a sum of a weight of the sacrificial layer removed from the first via and a weight of a portion removed from at least the contact region. Further, the quality of the extended via is determined based on the quality indicator.

Aspects of the disclosure provide a method that can include forming a first structure that includes a sacrificial layer above a semiconductor substrate and forming stacked insulating layers over the first structure. The method also includes forming a via extending through the stack of insulating layers and into the sacrificial layer by removing a portion of the stack and a portion of the sacrificial layer, and removing the stacked insulating layers to form a second structure. The method further includes determining a first weight of the first structure and a second weight of the second structure, respectively, and determining a weight of the removed portion from the sacrificial layer based on the first weight and the second weight. In an embodiment, a thickness of the portion of the sacrificial layer is less than a thickness of the sacrificial layer. In an embodiment, the stacked insulating layers are selectively removed to avoid removal of the sacrificial layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
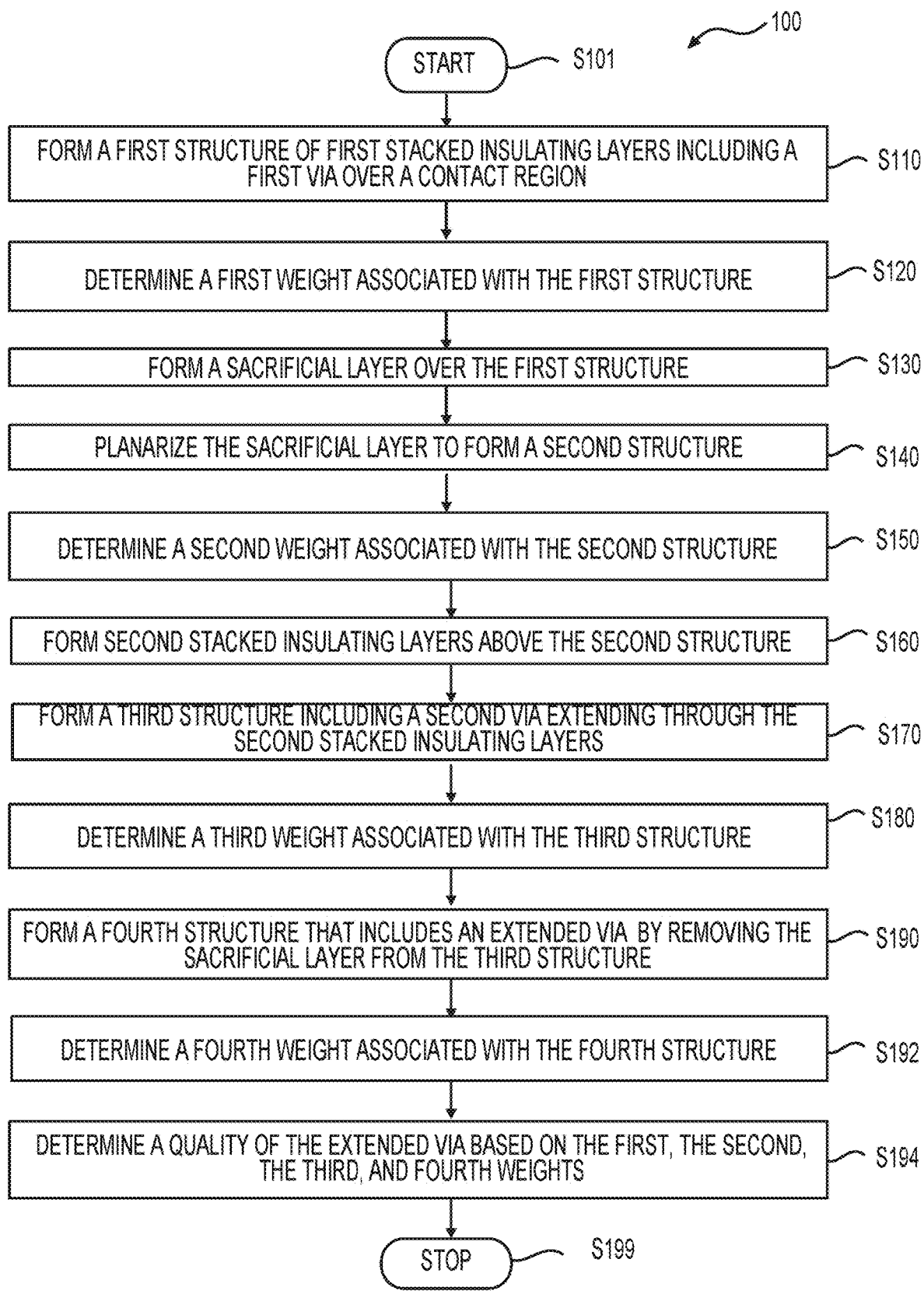
FIG. 1 shows a flow chart outlining the process for semiconductor fabrication according to an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a flow chart outlining an exemplary process 100 for semiconductor fabrication according to an embodiment of the disclosure. In various embodiments, the process 100 is used to fabricate a semiconductor device 200 shown in FIGS. 2-6, and 7A-7C. FIGS. 2-6, and 7A-7C are cross-sectional views of a portion of the semiconductor device 200 at various steps of the process 100 according to some embodiments of the disclosure. As used herein, a semiconductor device can include one or more transistors (e.g., field-effect transistors and floating-gate transistors), integrated circuits, a semiconductor chip (e.g., memory chip including a three-dimensional (3D) NAND memory device, a logic chip on a semiconductor die), a stack of semiconductor chips, a semiconductor package, a semiconductor wafer, and the like.

According to aspects of the disclosure, a semiconductor device can include a string of transistors stacked above a substrate of the semiconductor device to increase a transistor density, i.e., a number of transistors per unit area. The stack of transistors further includes gate structures surrounding a channel layer extending above the substrate. A conductive path having relatively low resistance can be formed in the channel layer when suitable voltages are applied to the gate structures. In various embodiments, the process 100 is used to form an extended via, and subsequently, the channel layer is formed in the extended via. To increase the transistor density, the extended via has a high aspect ratio (HAR) where an aspect ratio of a structure refers to a ratio of a height of the structure over a width of the structure.

According to aspects of the disclosure, the extended via with the HAR includes multiple vias stacked above the substrate. The multiple vias can be formed using multiple manufacturing steps of the process 100. In order to determine a quality of the extended via, multiple weights associated with the semiconductor device at various manufacturing steps of the process 100 are determined, and the quality of the extended via is determined based on the multiple weights. In an example, the semiconductor device is the semiconductor device 200.

Figure 5:
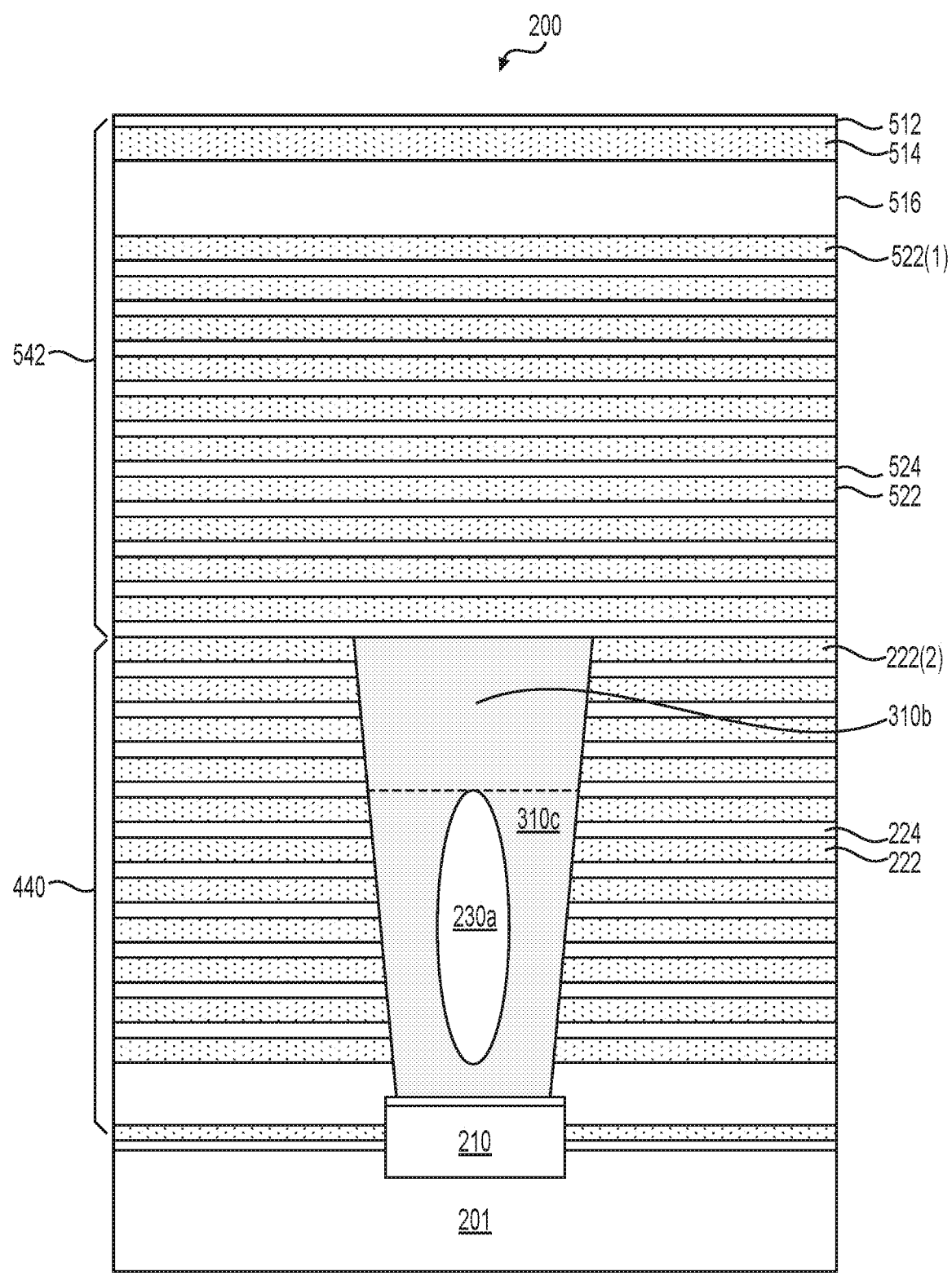
Figure 6:
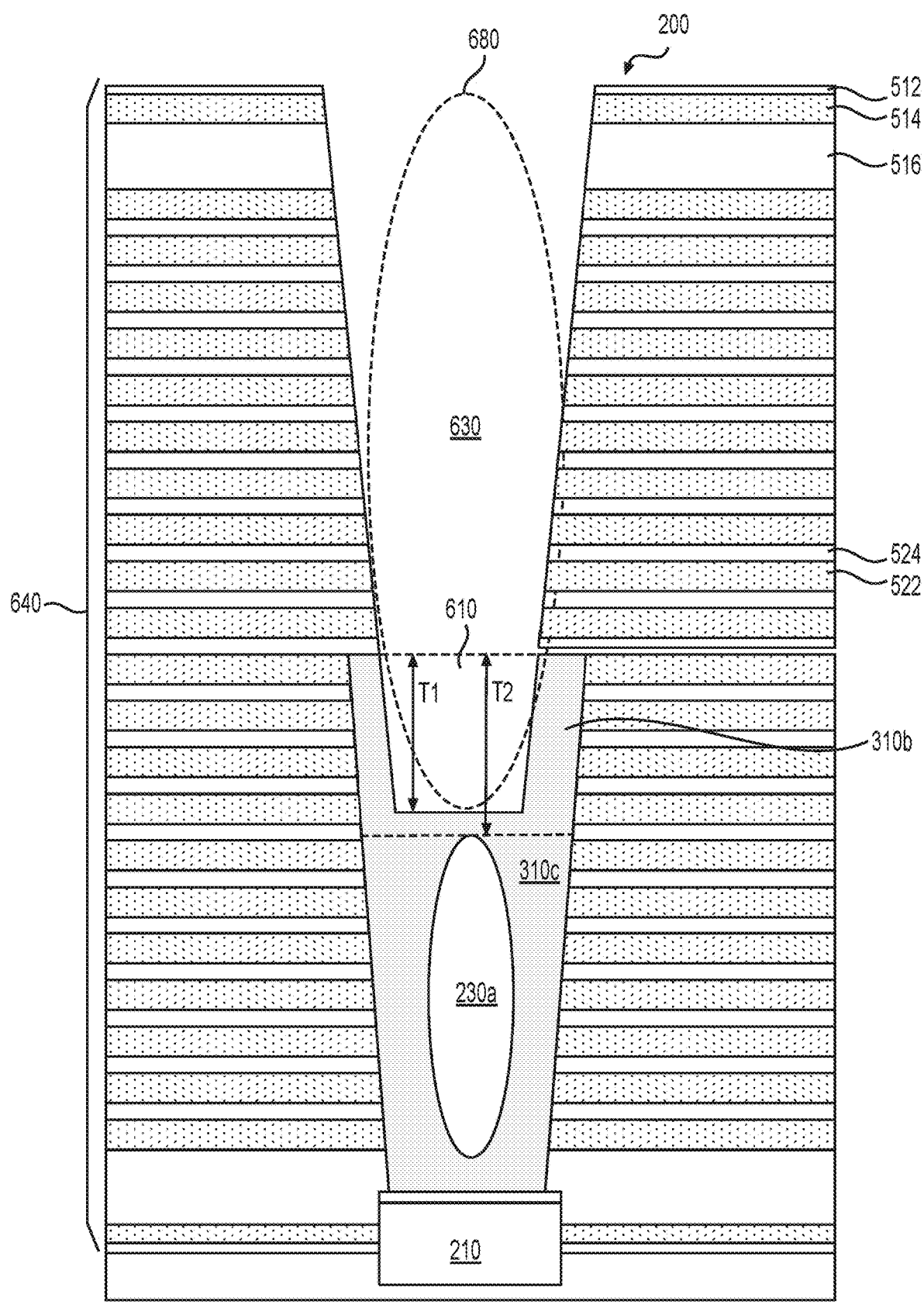
Figure 7A:
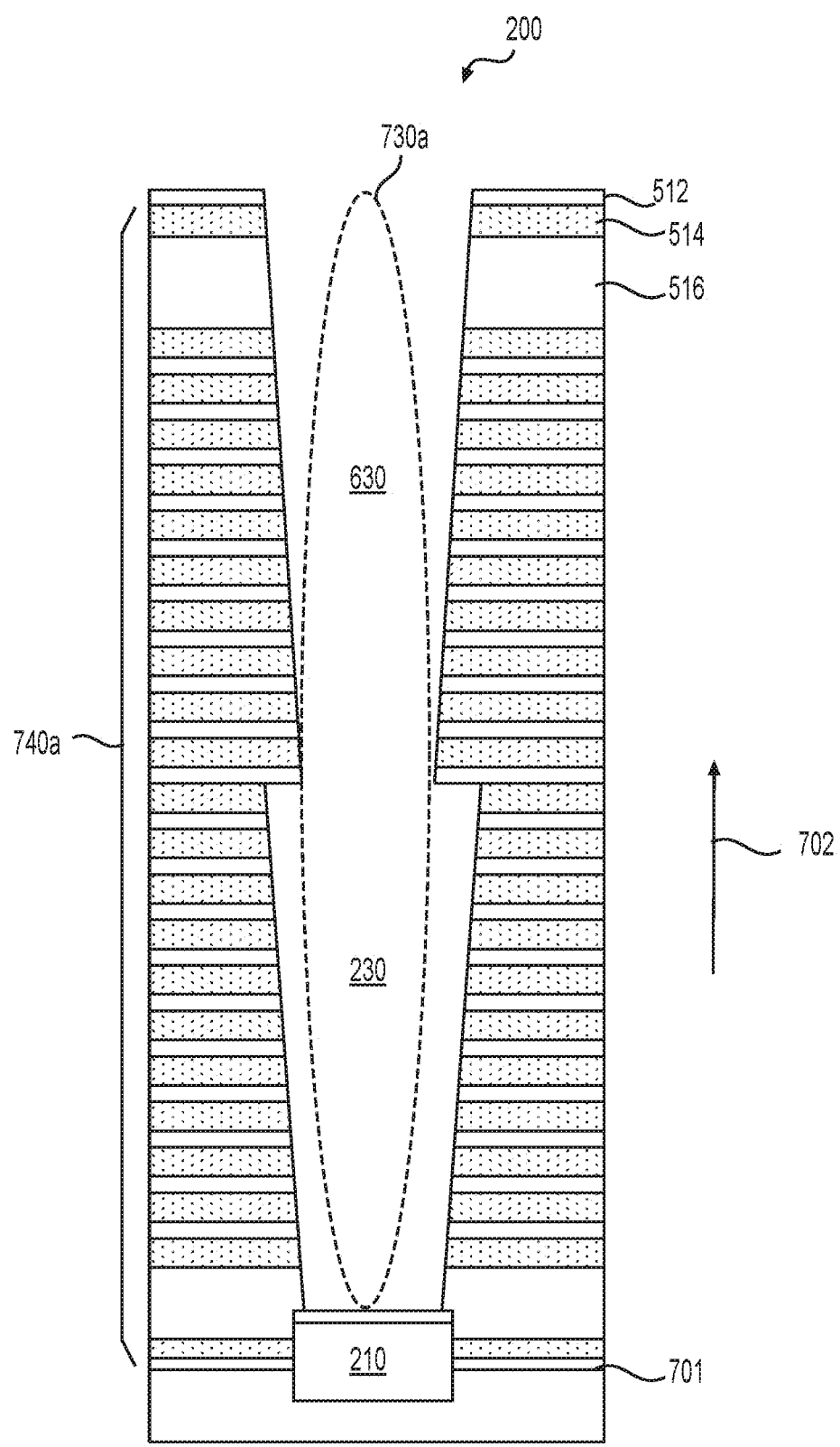

FIGS. 1-6, 7A-7C show the semiconductor 200 manufactured by the process 100. Referring to FIG. 7A, an extended via 730a with a HAR includes two vias, a first via 230 and a second via 630 stacked above the first via 230. The first via 230 has a first aspect ratio, and the second via 630 has a second aspect ratio. In an example, the HAR is equal to a sum of the first aspect ratio and the second aspect ratio. As described above, to manufacture the extended via 730a with the HAR, the first via 230 and the second via 630 are formed sequentially in multiple manufacturing steps of the process 100.

As described above, in order to determine the quality of the extended via efficiently and non-destructively, the multiple weights associated with the semiconductor device 200 at the various manufacturing steps of the process 100 are determined, and the quality of the extended via is determined based on the multiple weights.

In general, the process 100 can be combined with other process flows to manufacture other suitable semiconductor components (not shown), such as any suitable types of transistors, bipolar junction transistors, resistors, capacitors, inductors, diodes, fuses, and the like on the semiconductor device 200. In various embodiments, the process 100 can also be combined with additional process flows to manufacture other suitable circuits, for example, a peripheral circuit for driving the memory cells, a sense amplifier for reading data stored in the memory cells, a decoding circuit, and the like. The steps of the process 100, including any descriptions given with reference to FIGS. 1-6, 7A-7C, are merely exemplary and are not intended to be limiting.

Figure 2:
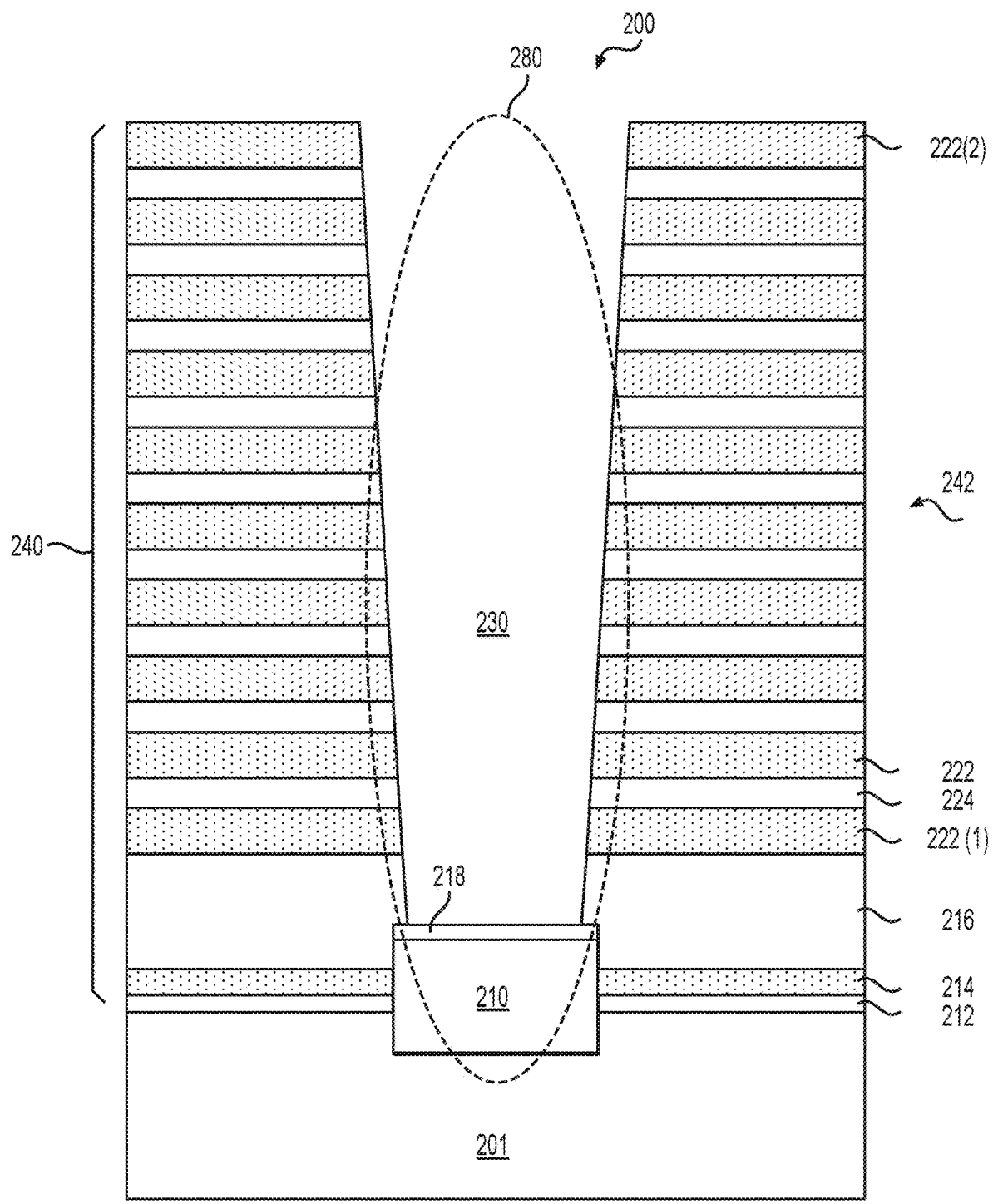
FIGS. 2-6, 7A-7C are cross-sectional views of a portion of a semiconductor device 200 at various steps of the process according to some embodiments of the disclosure.

Referring to FIGS. 1 and 2, the process 100 starts at S101, and proceeds to S110. At S110, the first structure 240 including the first via 230 is formed over a semiconductor substrate (referred to as a substrate) 201 of a semiconductor device 200. The substrate 201 can be any suitable substrate, and can be processed with various suitable features. In an embodiment, the substrate 201 is formed of any suitable semiconductor material, such as silicon (Si), germanium (Ge), SiGe, a compound semiconductor, an alloy semiconductor, and the like. In another embodiment, the substrate 201 includes various layers, including conductive or insulating layers formed on a semiconductor substrate. In an example, the substrate 201 is a silicon-on-insulator (SOI) substrate. In an embodiment, the substrate 201 includes an epitaxial layer formed on insulator. In an embodiment, the substrate 201 includes various doping configurations depending on design requirements.

The first structure 240 are manufactured using a variety of semiconductor processing techniques, such as photolithography, chemical vapor deposition (CVD) including for furnace CVD, low pressure CVD, and the like, physical vapor deposition (PVD), atomic layer deposition (ALD), dry etching, wet etching, chemical mechanical planarization (CMP), ion implantation, and the like.

Referring to FIG. 2, first stacked insulating layers 242 are formed over the substrate 201. The first stacked insulating layers 242 include alternate first insulating layers 222 and second insulating layers 224. In some examples, the first stacked insulating layers 242 further include one or more additional insulating layers between the substrate 201 and a lowermost insulating layer of the first insulating layers 222 and the second insulating layers 224, such as the first insulating layer 222(1). In an example, the one or more additional insulating layers include the insulating layers 212, 214, and 216 sequentially formed over the substrate 201. Each of the insulating layers 212, 214, and 216 can include one or more sublayers of dielectric materials. In some examples, the insulating layer 212 includes $SiO_2$ having a thickness about 18 nm, the insulating layer 214 includes silicon nitride having a thickness of 10 to 100 nm, the insulating layer 216 includes $SiO_2$ having a thickness of 130-180 nm.

The first insulating layers 222 and the second insulating layers 224 are alternately formed over the insulating layer 216. The first and second insulating layers 222 and 224 can include any suitable dielectric materials that have, for example, different etch rate. In an example, the first insulating layers 222 are formed with silicon nitride, the second insulating layers 224 are formed by using a dielectric material, such as $SiO_2$, that has a different etch rate from that of the insulating layers 222. In various embodiments, the first insulating layers 222 are removed and replaced with suitable gate structures in subsequent steps, and the second insulating layers 224 can electrically insulate the gate structures from each other and other components in the semiconductor device 200.

In some examples, the gate structures correspond to word lines in memory cells. Accordingly, a number of the first insulating layers 222 may vary according to a number of word lines (also a number of the memory cells) in the first structure 240. Thicknesses of the first insulating layers 222 can be different from or identical to each other. In an example, the thicknesses of the first insulating layers 222 range from 20 to 50 nm. In an example, the thickness of the first insulating layers 222 is about 35 nm. Any suitable deposition process, such as CVD, PVD, ALD, or any combination thereof, can be applied to form the first insulating layers 222.

The second insulating layers 224 can have any suitable thicknesses, such as between 20 and 40 nm, and can be formed by performing CVD, PVD, ALD, or any combination thereof. In an example, the thickness of the second insulating layers 224 is 25 nm.

In an example, a thickness of the first structure is about 1-10 microns, such as 4-6 microns. Any suitable number of transistors or memory cells can be stacked in the first structure 240, such as 16, 32, 64, 96, and the like.

In the example (not shown in FIG. 2), a mask layer is formed and patterned over the topmost insulating layer 222(2) to protect the semiconductor device 200 during subsequent processing. The mask layer can include one or more hard mask sublayers, such as silicon nitride and silicon oxide. In various embodiments, the mask layer can be patterned according to any suitable techniques, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like.

An opening 280 extending into the substrate 201 can be formed according to the mask layer using any suitable process. In an example, an upper portion of the substrate 201, portions of the insulating layers 212, 214, and 216, the first insulating layers 222, and the second insulating layers 224, exposed by the patterned mask layer, are removed to form the opening 280. The opening 280 is formed using an etching process, such as a wet etching, a dry etching such as a plasma etch referred to as a plasma punch, or a combination thereof.

The opening 280 can have any suitable shape, such as a circular pillar-shape, a square pillar-shape, an oval pillar-shape, or any other suitable shapes. In an example, a top critical dimension (CD) of the opening 280 can range from 120 to 150 nm and a bottom CD can range from 50 to 70 nm, and the opening 280 can have a tapered profile where the bottom CD is smaller than the top CD. The tapered profile can be obtained by tapering a mask profile of the patterned mask layer, adjusting parameters of the etching process, and the like. A tapered profile can help subsequent deposition steps and improve sidewall coverage. In some examples, a subsequent plasma ashing and a wet clean can be applied to remove the remaining mask layer.

In various embodiments, a contact region 210 that electrically couples with a channel layer to be formed in subsequent steps is formed from the substrate 201 in the opening 280. The contact region 210 can be formed using silicon deposited via a selective epitaxially growth technique. The contact region 210 can include monocrystalline Si. In an example, the contact region 210 has a thickness of 190 nm. In general, an oxide layer 218 can subsequently be formed over the contact region 210 by an oxidation process. For example, the oxide layer 218 includes silicon oxide with a thickness of 2-5 nm. The first via 230 is formed in the opening 280 and is above the contact region 210 and the oxide layer 218.

At S120, a first weight (or a first mass) associated with the first structure 240 is determined. In general, the first weight can be indicated by a parameter that is associated with an amount of materials in the first structure 240. The first weight can be obtained using any suitable methods and have any suitable units. In some examples, the first weight can include additional materials external to the first structure 240. For example, the first weight is determined by weighing a semiconductor wafer including the semiconductor device 200 having the first structure 240 manufactured. In an example, a scale having a precision about 10 micrograms is used to weigh a semiconductor wafer. In an example, the scale is used to weigh a plurality of semiconductor wafers. The first weight can have a unit of grams, milligrams, micrograms, and the like.

Figure 3:
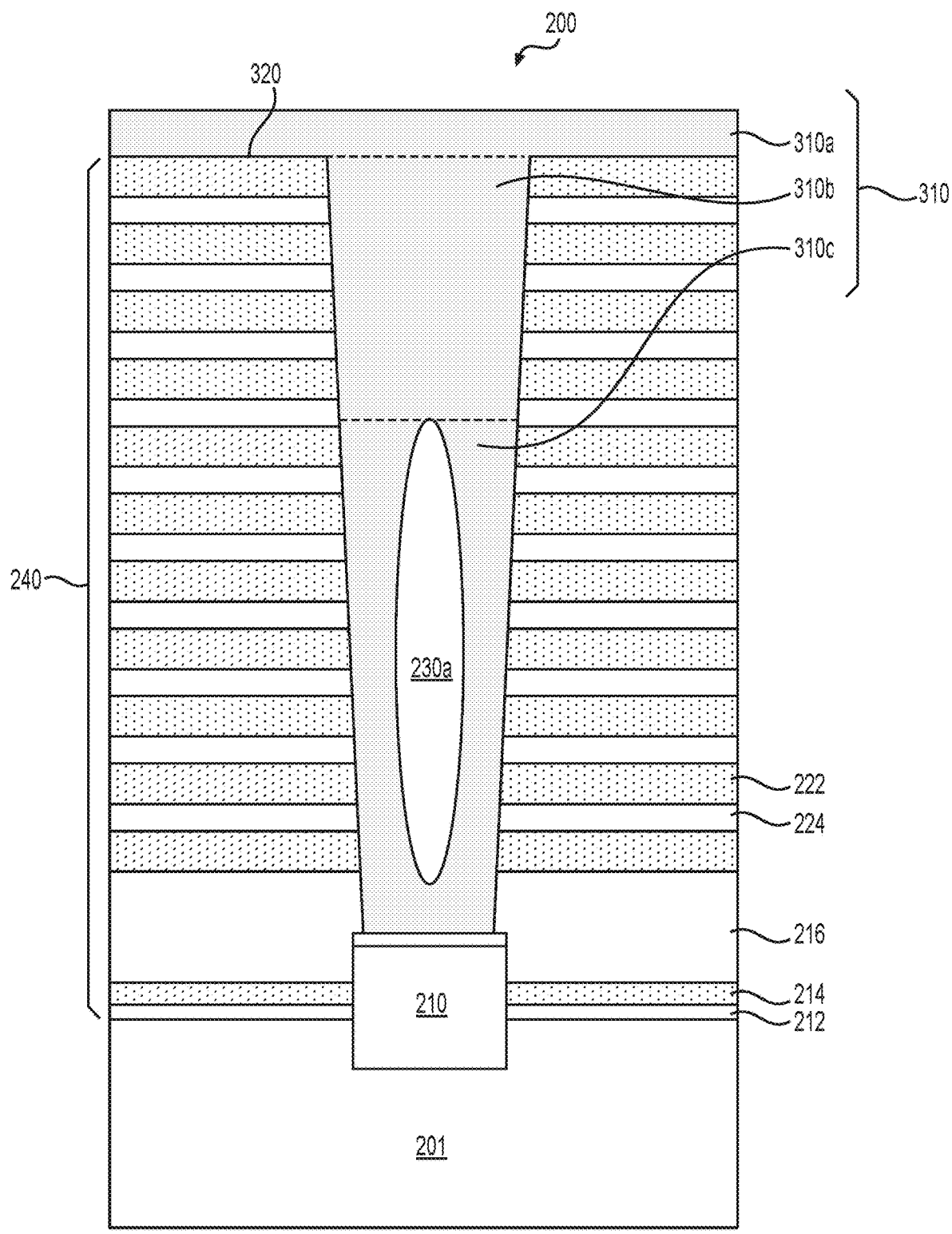

Referring to FIGS. 1 and 3, at S130, at least a top region of the first via 230 is filled with a sacrificial layer 310. In an example, the sacrificial layer 310 includes a first portion 310a that is above the first structure 240, a second portion 310b that fills the top region of the first via 230, and a third portion 310c that is below the second portion 310b. In some examples, the third portion 310c surrounds a portion 230a of the first via 230 where the portion 230a is not filled by the sacrificial layer 310. In some embodiments, the sacrificial layer 310 completely fills the first via 230, thus, the third portion 310c and the second portion 310b can be combined into the second portion 310b.

In general, the sacrificial layer 310 can be conformably formed by depositing one or more sacrificial materials over a top surface of the oxide layer 218. In various embodiments, the sacrificial layer 310 is also formed over a top surface 320 of the first structure 240 and sidewalls of the first via 230. The sacrificial layer 310 can be formed using any suitable process, such as an ALD process, a CVD process, a PVD process, or a combination thereof. For example, the sacrificial layer 310 can be formed of polysilicon, tungsten, and the like. In an example, the sacrificial layer 310 is formed of polysilicon. A thickness of the top portion 310b can range from 200 nm to 300 nm based on manufacturing requirements and/or processes. In an example, the thickness of the top portion 310b is 250 nm.

Figure 4:
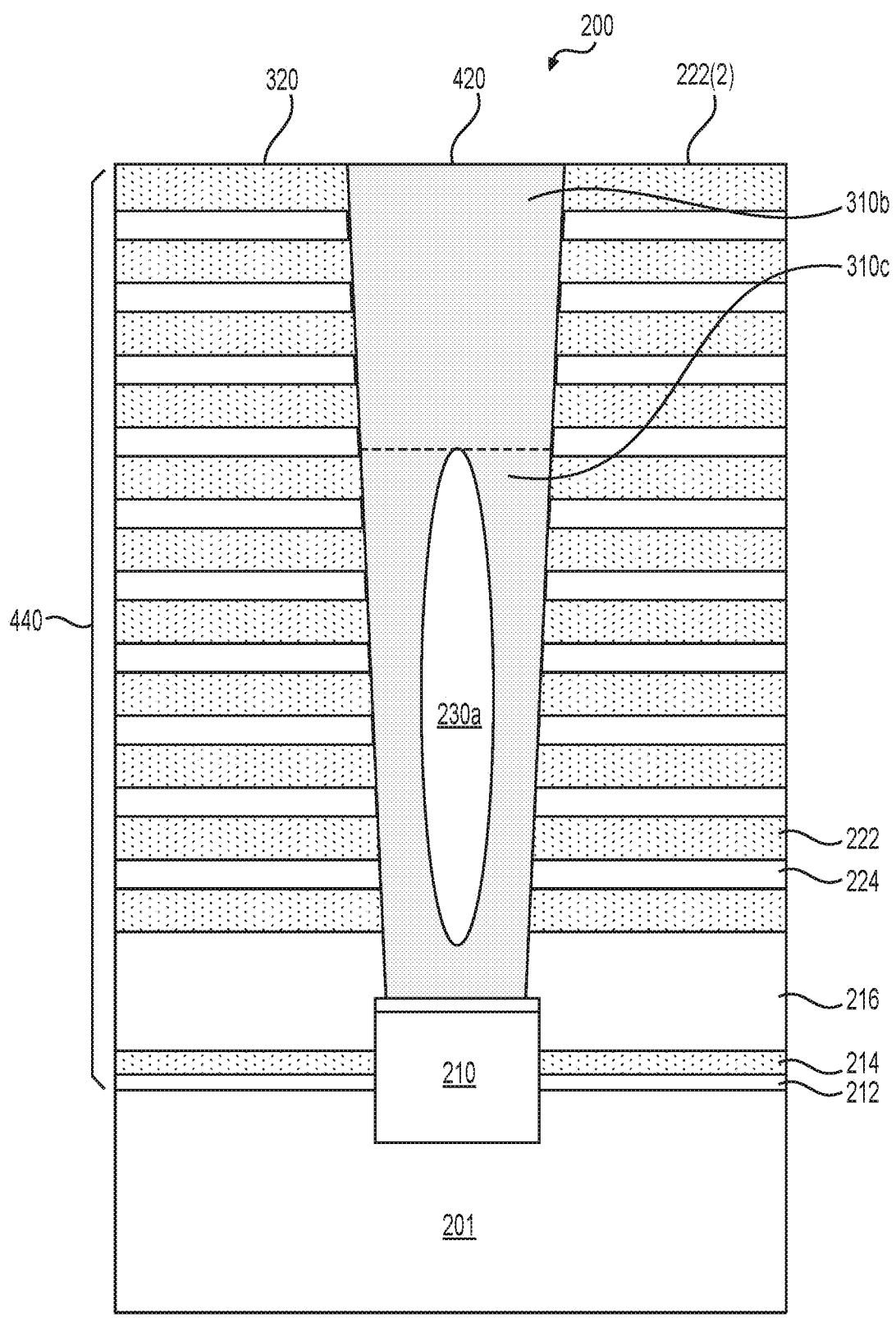

Referring to FIGS. 1, 3, and 4, at S140, a second structure 440 is formed using a surface planarization process such as CMP to remove any excessive semiconductor material deposited over the top surface 320 of the first structure 240. In various examples, the surface planarization process removes the first portion 310a. Accordingly, the top surface 320 of the first structure 240 and a top surface 420 of the top portion 310b are coplanar, facilitating subsequent formation of second stacked insulating layers 542 over the second structure 440.

Similar to step S120, at S150, a second weight associated with the second structure 440 is determined. For example, the second weight is determined by weighing the semiconductor wafer including the semiconductor device 200 having the second structure 440 manufactured.

Referring to FIGS. 1 and 5, at S160, the second stacked insulating layers 542 are formed over the second structure 440. The second stacked insulating layers 542 include the third insulating layers 522 and the fourth insulating layers 524 alternately formed on the second structure 440. In some examples, the second stacked insulating layers 542 further include one or more additional insulating layers, such as insulating layers 516, 514, and 512 that are sequentially formed over the topmost first insulating layer 522(1). Similar to the first insulating layers 222, in various embodiments, the third insulating layers 522 are removed and replaced with additional gate structures for additional transistors (or memory cells) in subsequent steps. The fourth insulating layers 524 can electrically insulate the additional gate structures from each other and other components in the semiconductor device 200.

In various embodiments, the third insulating layers 522 can have similar or identical materials, thicknesses, and functions as those of the first insulating layers 222. In various embodiments, the fourth insulating layers 524 can have similar or identical materials, thicknesses, and functions as those of the second insulating layers 224. Therefore, detailed description of the materials, the thickness, and the functions of the third and fourth insulating layers 522 and 524 is omitted for purposes of clarity. Similarly, a number of the third insulating layers 522 may vary according to a number of the additional transistors (or memory cells) formed based on the second stacked insulating layers 542. Any suitable deposition process, such as CVD, PVD, ALD, or any combination thereof, can be applied to form the third and fourth insulating layers 522 and 524. In an example, the third insulating layers 522 and the fourth insulating layers 524 are formed using processes identical to those used for the first insulating layers 222 and the third insulating layers 224, respectively.

In an example, a thickness of the second stacked insulating layers 542 is about 1-10 microns, such as 4-6 microns. A number of the additional transistors can be 32, 64, 96, and the like.

In an embodiment, the insulating layers 512, 514, and 516 form a mask layer, a hardmask layer, and the like. In another embodiment, the insulating layers 512, 514, and an upper portion of the insulating layer 516 form a mask layer, a hard mask layer, and the like. The insulating layers 512 and 516 can include $SiO_2$ and the insulating layer 514 can include silicon nitride.

Referring to FIGS. 1 and 6, at S170, a third structure 640 is formed by forming an opening 680 extending through the second stacked insulating layers 542 and into the second portion 310b of the sacrificial layer 310. Portions of the insulating layers 516, the third insulating layers 522, and the fourth insulating layers 524, exposed by the patterned hard mask layer including the insulating layers 512, 514, and optionally the upper portion of the insulating layer 516, are removed to form the opening 680. In an embodiment, the opening 680 is formed using an etching process, such as a wet etching, a dry etching, or a combination thereof.

In various embodiments, the opening 680 includes the second via 630 and a recessed region 610 in the sacrificial layer 310. The second stacked insulating layers 542 surround the second via 630. The second via 630 can have any suitable shape and dimensions, for example, that are similar or identical to those of the first via 230. The recessed region 610 can be formed in the sacrificial layer 310 by removing a top portion from the sacrificial layer 310. In an embodiment, the top portion from the sacrificial layer 310 is part of the second portion 310b, and a thickness T1 of the recessed region 610 is less than a thickness T2 of the second portion 310b.

Similar to the steps S120 and S150, at S180, a third weight associated with the third structure 640 is determined. For example, the third weight is determined by weighing the semiconductor wafer including the semiconductor device 200 having the third structure 640 manufactured.

Referring to FIGS. 1 and 7A, at S190, a fourth structure 740a including the extended via 730a is formed by removing the sacrificial layer 310 from the third structure 640. The extended via 730a further includes the first via 230 and the second via 630. In an example, the second via 630 is stacked above the first via 230, and the extended via 730a is aligned along a vertical direction 702 that is substantially perpendicular to a top surface 701 of the substrate 201. In various embodiments, an etching process, such as a wet etching, a dry etching, or a combination thereof, is used to remove the sacrificial layer 310. The etching process can be selective to remove the one or more materials in the sacrificial layer 310 and minimally affect the first and second stacked insulating layers 242 and 542 that surround the extended via 730a. In an example, the sacrificial layer 310 includes polysilicon, the first and second stacked insulating layers 242 and 542 include silicon oxide and silicon nitride, thus the etching process is controlled to selectively remove polysilicon and minimally affect silicon oxide and silicon nitride.

Note that FIG. 7A shows an example of an optimal extended via, i.e., the extended via 730a where the extended via 730a includes no or minimal amount of the sacrificial layer 310 and the contact region 210 below the extended via 730a is not or minimally affected. In general, when the HAR of the extended via 730a increases, for example, with an increase of a number of the memory cells stacked in the fourth structure 740a, the etching process can fail to achieve an optimal result, such as shown in FIG. 7A.

Figure 7B:
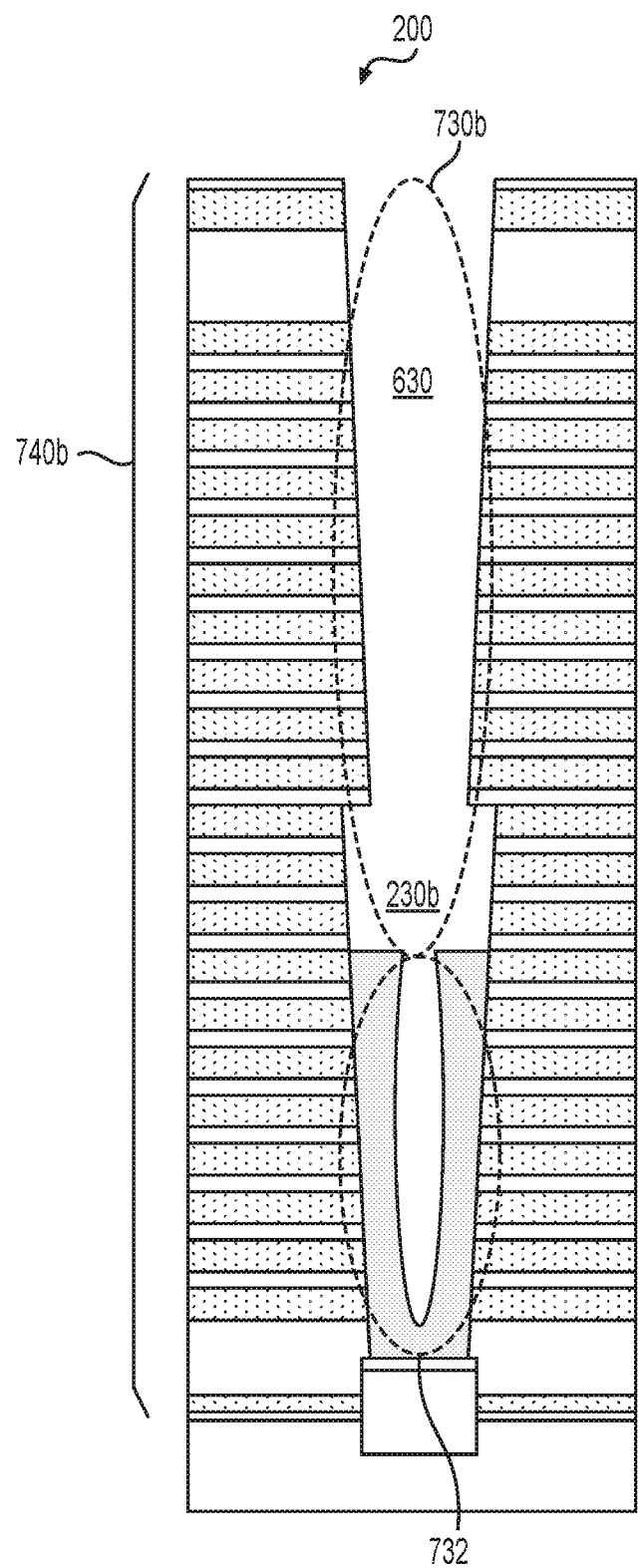

FIG. 7B shows an example of a suboptimal extended via 730b in a fourth structure 740b fabricated using S190. The fourth structure 740b includes a portion 732 of the sacrificial layer 310, for example, due to under-etching of the sacrificial layer 310. The extended via 730b includes the second via 630 and a shortened first via 230b that is above the unremoved portion 732. Accordingly, the extended via 730b is shortened compared with the extended via 730a. When an amount of the unremoved portion 732 is above a certain threshold, device performances of the semiconductor device 200 can be compromised.

Figure 7C:
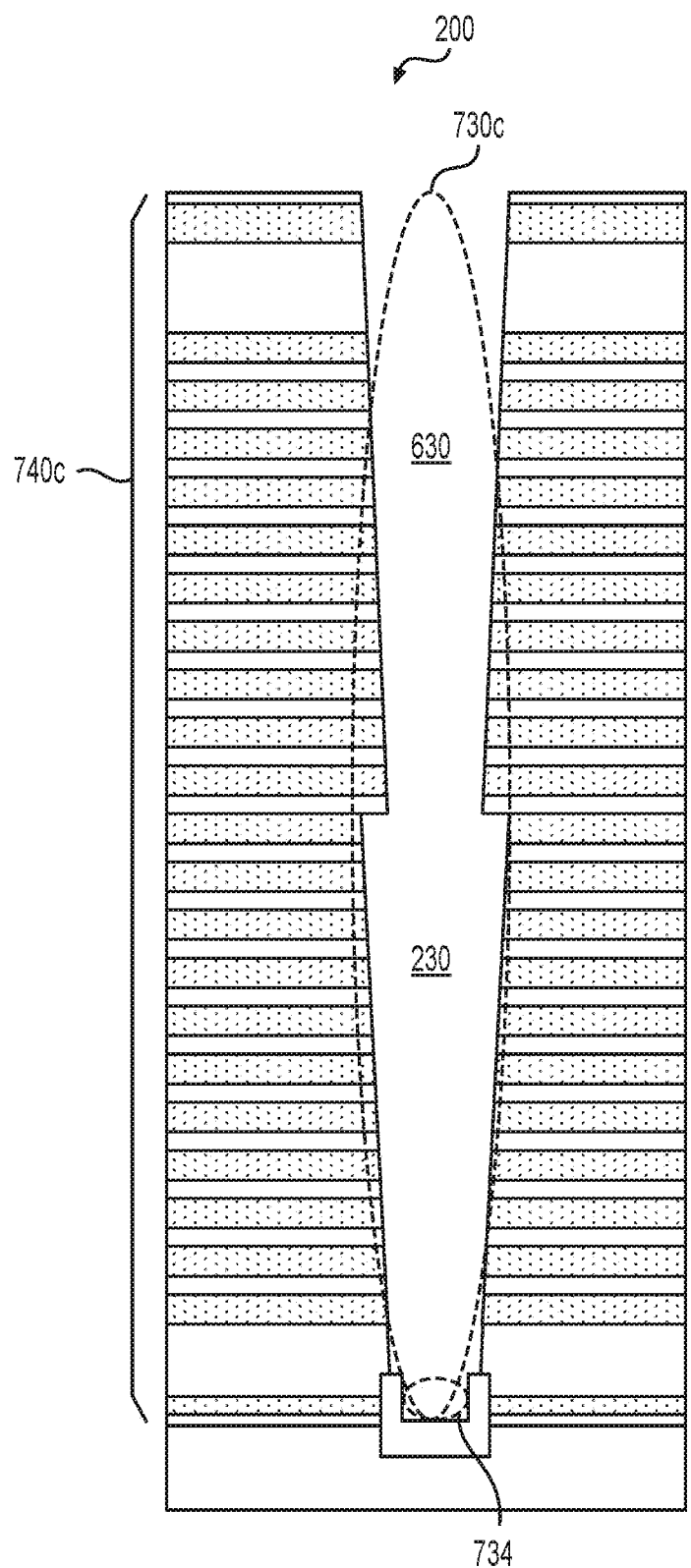

FIG. 7C shows an example of a suboptimal extended via 730c in a fourth structure 740c fabricated using S190. A recessed region 734 is formed in the fourth structure 740c, for example, due to over-etching of at least the contact region 210. In addition to the second via 630 and the first via 230, the extended via 730c further includes the recessed region 734. In some examples, the contact region 210 is completely removed. Further, a portion of the substrate 201 can be removed, and the recessed region 734 can extend into the substrate 201. Accordingly, the extended via 730c is lengthened compared with the extended via 730a. When an amount of the recessed region 734 is above a certain threshold, device performances of the semiconductor device 200 can be compromised.

Similarly, at S192, a fourth weight associated with the fourth structure, such as one of the fourth structures 740a-740c, is determined. For example, the fourth weight is determined by weighing the semiconductor wafer including the semiconductor device 200 having one of the fourth structures 740a-740c manufactured.

In general, a quality of an extended via, such as one of the extended vias 730a-730c, can be determined using any suitable methods that, for example, determine whether the sacrificial layer 310 in the first via 230 of the second structure 440 is removed without removing the contact region 210. In an example, the quality of the extended via can be determined efficiently and non-destructively by comparing the fourth weight associated with one of the fourth structures 740a-740c with a pre-determined weight corresponding to a weight associated with an optimal fourth structure, such as the fourth structure 740a.

Alternatively, according to aspects of the disclosure, in order to determine the quality of the extended via efficiently and non-destructively, the first to fourth weights of the semiconductor device 200 at the various manufacturing steps of the process 100 are determined. At S194, the quality of the extended via is determined based on the first to fourth weights. According to aspects of the disclosure, the recessed region 610 is formed in the third structure 640, the quality of the extended via is further determined based on the first to fourth weights and a weight W of the removed top portion of the sacrificial layer 310 when forming the recessed region 610. In various embodiments, the weight W can be obtained from a pre-determined weight, as will be described in reference to FIGS. 9-12.

Various embodiments can be used to determine the quality of the extended via based on the first to fourth weights and the weight W of the removed top portion of the sacrificial layer 310. In a first embodiment, a first weight difference d1 is determined based on the first weight W1 and the second weight W2, and a second weight difference d2 is determined based on the third weight W3, the fourth weight W4, and the weight W of the removed top portion of the sacrificial layer 310, and subsequently, the quality of the extended via is determined based on the first weight difference d1 and the second weight difference d2. In a second embodiment, a quality indicator is determined based on the first to fourth weights W1-W4 and the weight W, and subsequently, the quality of the extended via is determined based on the quality indicator.

More specifically, in the first embodiment, the first weight difference d1 corresponds to a weight of the sacrificial layer 310 in the first via 230 of the second structure 440, as shown in FIG. 4. In an example, the first weight difference d1 is a difference between the second weight W2 and the first weight W1, thus d1=W2−W1 and d1>0. The second weight difference d2 corresponds to a sum of a weight of the sacrificial layer removed from the first via and a weight of a portion removed from at least the contact region 210, as shown in FIGS. 6 and 7A-7C. In an example, the second weight difference d2 is obtained as d2=W3+W−W4. Note that when the recessed region 610 is not formed, the weight W is zero, and d2=W3−W4.

The quality of the extended via, such as the extended vias 730a-730c, can be determined based on the first weight difference d1 and the second weight difference d2 using any suitable methods. In some examples, a difference d between the first weight difference d1 and the second weight difference d2 is obtained as d=d2−d1. Accordingly, the difference d can be a negative value, zero, and a positive value. Further, multiple conditions can be pre-defined in order to determine the quality of the extended via. The multiple conditions can include a first condition, a second condition, a third condition, and the like.

The first condition can include one or more first thresholds, such as th1_1, th1_2, and the like. Here, the first thresholds can be any non-negative values. According to the first condition, when an absolution value of the difference d is less than the first threshold, such as |d|≤th1_1, the quality of the extended via is determined to be optimal, such as the extended via 730a in FIG. 7A. Alternatively, according to the first condition, when the difference d is within a certain range, such as −th1_2≤d≤th1_1, −th1_1≤d≤th1_1, and the like, the quality of the extended via is determined to be optimal. The first thresholds can be pre-defined depending on manufacturing requirements and/or device performance. Since the first threshold can be a small positive value, the optimal extended via can include a relatively small amount of the sacrificial layer 310. Alternatively, the optimal extended via can include a relatively small recessed region in the contact region 210.

Similarly, the second condition can include one or more second thresholds that are negative values, such as th2_1, th2_2, and the like. According to the second condition, when the difference d is less than the second threshold, i.e., d<th2_1, the extended via is under-etched, thus including a portion of the sacrificial layer 310, such as the extended via 730b in FIG. 7B.

Similarly, the third condition can include one or more third thresholds that are positive values, such as th3_1, th3_2, and the like. According to the third condition, when the difference d is larger than the third threshold, i.e., d>th3_1, the extended via is over-etched, thus a portion of at least the contact region 210 is removed, such as the extended via 730c in FIG. 7C.

In an example, the first threshold, the second threshold, and the third threshold can be modified from a single threshold th1_1. For example, the first threshold and the third threshold are equal to th1_1, and the second threshold is equal to −th1_1. The first, second, and third condition can also be adapted/combined accordingly. When the difference d satisfies −th1_1≤d≤th1_1, or |d|≤th1_1, the extended via is determined to be optimal, thus, the extended via is determined to include a minimal amount of the sacrificial layer 310 and a minimal amount of the contact region 210 is removed. When the difference d satisfies d<−th1_1, the extended via is determined to be under-etched. When the difference d satisfies d>th1_1, the extended via is determined to be over-etched.

More specifically, in the second embodiment, the quality indicator is determined based on the first to fourth weights W1-W4 and the weight W. In an example, the quality indicator q=d1−d2=(W2−W1)−(W3+W−W4). In an example, the quality indicator q is zero, and the extended via is determined to be optimal. In an example, the quality indicator q larger than zero, and the extended via is determined to be under-etched. In an example, the quality indicator q is less than zero, and the extended via is determined to be over-etched. Alternatively, when the quality indicator q is within a first range, such as −th1_1≤q≤th1_1, the extended via is determined to be optimal. When the quality indicator q larger than a threshold, such as th1_1, and the extended via is determined to be under-etched. In an example, the quality indicator q is less than a threshold, such as −th1_1, the extended via is determined to be over-etched.

When the extended via 730a is determined to be optimal, the process 100 proceeds to S199 and terminates. When the extended via 730b is determined to be under-etched, the process 100 can return to S190. When the extended via 730c is determined to be over-etched, the process 100 proceeds to S199 and terminates, in addition, the semiconductor device 200 is discarded, and will not be processed further.

Note that the semiconductor device 200 is modified by the various steps in the process 100, as shown in FIGS. 2-6, and 7A-7C.

In general, the determination of the first to the fourth weights in the steps S120, S150, S180, and S192, can be implemented efficiently, for example, in a few seconds by using a scale. On the contrary, certain SEM and TEM inspections can take more than an hour. Further, a large number of semiconductor devices is fabricated on a same semiconductor wafer, thus the determination of the first to the fourth weights reveals qualities of a large number of extended vias in the large number of semiconductor devices, unlike certain methods that only reveal a smaller number of semiconductor devices on a relatively small portion of a semiconductor wafer. The determination of the first to the fourth weights is non-destructive. On the contrary, in certain SEM and TEM methods, a semiconductor wafer is cleaved. In certain bright field inspection, top layers (such as the first and second stacked insulating layers 242 and 542) are removed from a semiconductor wafer in order to inspect bottom layers (such as the contact region 210). Therefore, the process 100 is efficient and nondestructive in determining the quality of the extended via.

Precision of determining under-etching or over-etching the extended via using the respective steps in the process 100 is described below according to aspects of the disclosure. The following examples are used: a diameter of a semiconductor wafer is 300 millimeter (mm), semiconductor devices having extended vias are disposed over the semiconductor wafer, 25% of a surface area of the semiconductor wafer is occupied by the extended vias, the sacrificial layer 310 is formed of polysilicon, a weight can be determined with a preciseness of 10 micrograms, and the difference d is at least 40 micrograms (4 times the preciseness) in order to reliably determine that the extended vias are over-etched or under-etched.

In a first example shown in FIG. 7B, the portion 732 remains in the fourth structure 740b due to under-etching. When a height of the portion 732 is 3 microns and 0.034% of the extended vias are under-etched, the difference d is about 40 micrograms. Therefore, in the example described here, the process 100 can reliably determine that at least 0.034% of the extended vias are under-etched when the height of the portion 732 in the under-etched extended vias is 3 microns.

In a second example shown in FIG. 7C, the contact region 210 is over-etched, but a portion of the contact region 210 remains. When a height of all the contact regions 210 is reduced by 1 nm, the difference d is about 40 micrograms. Therefore, in the example described here, a 1 nm over-etching of the contact regions 210 can be reliably determined.

In a third example (not shown), a thickness of the contact region 210 is 190 nm, 0.5% of the contact regions 210 is completely removed without affecting the substrate 201, the difference d is about 40 micrograms. Therefore, in the example described here, 0.5% of removal rate of the contact regions 210 can be reliably detected. In general, the precision varies when a specific scenario changes.

As described above, the semiconductor device 200 can be a nonvolatile memory device, such as a 3D NAND flash memory device where the transistors (or the memory cells) are stacked along the direction 702 to increase the storage density. Note that any suitable number of memory cells can be stacked in the semiconductor device 200, depending on a capacity of the semiconductor device 200. As an example, the number of memory cells in the fourth structure 740a is 64, 128, and the like, and a thickness of the fourth structure 740a ranges from 8 to 12 microns.

Note that additional steps can be provided before, during, and after the process 100, and one or more of the steps described above can be replaced, eliminated, adapted, and/or performed in different order for additional embodiments of the process 100. For example, when the semiconductor device 200 is a 3D NAND flash memory device, suitable channel structures that include a channel layer and a gate dielectric structure can be formed in the extended via 730a.

Subsequently, the first insulating layers 222 and 522 can be replaced with suitable gate structures including a high dielectric constant material and a metal layer. In an example, the suitable gate structures control operations of the memory cells in the semiconductor device 200. In subsequent process steps, various additional interconnect structures (e.g., metallization layers having conductive lines and/or vias) may be formed over the semiconductor device 200. Such interconnect structure electrically connect the semiconductor device 200 with other contact structures and/or active devices to form functional circuits. Additional device features such as passivation layers, input/output structures, and the like may also be formed.

Figure 8:
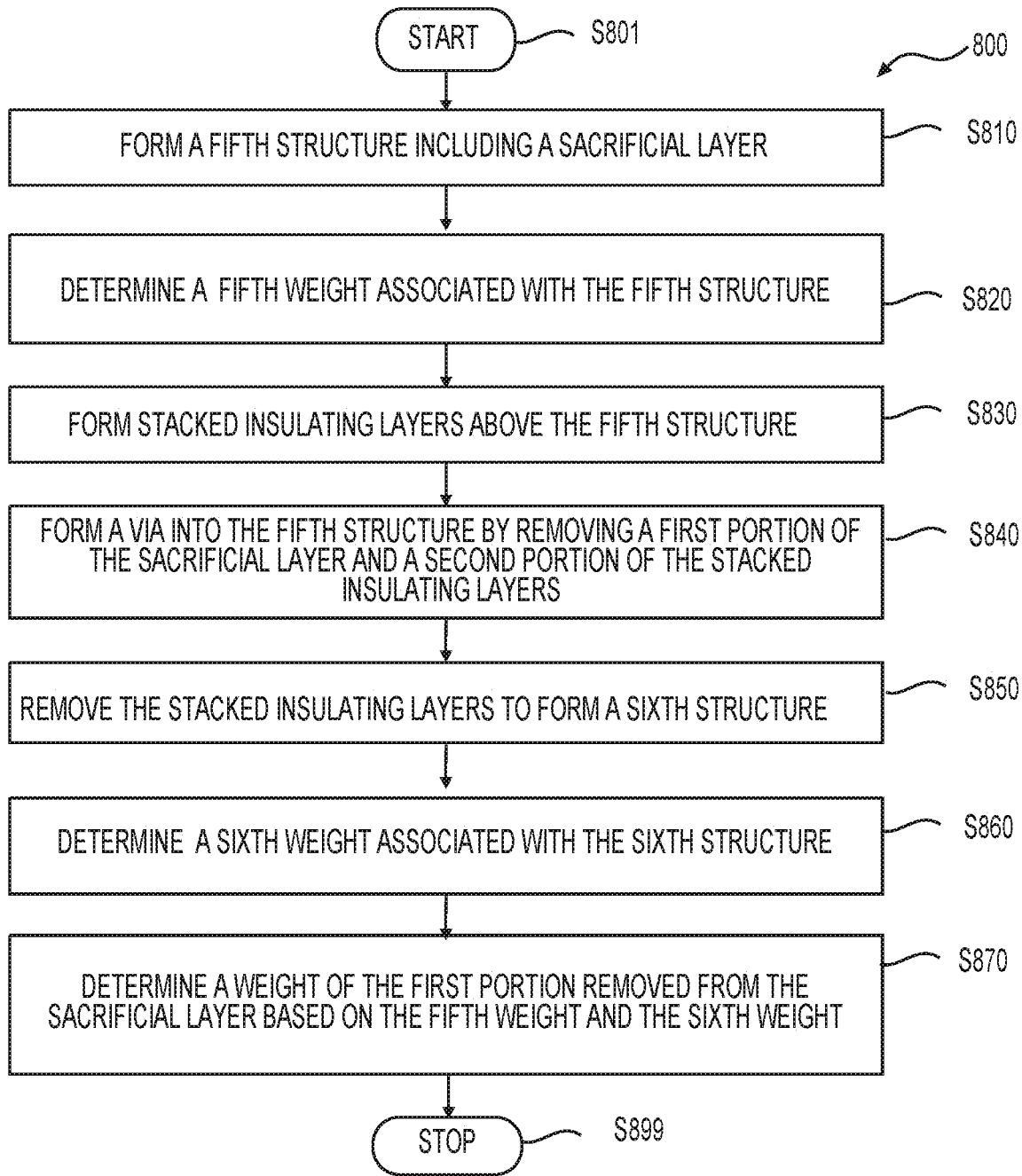
FIG. 8 shows a flow chart outlining a process according to an embodiment of the disclosure.
Figure 9:
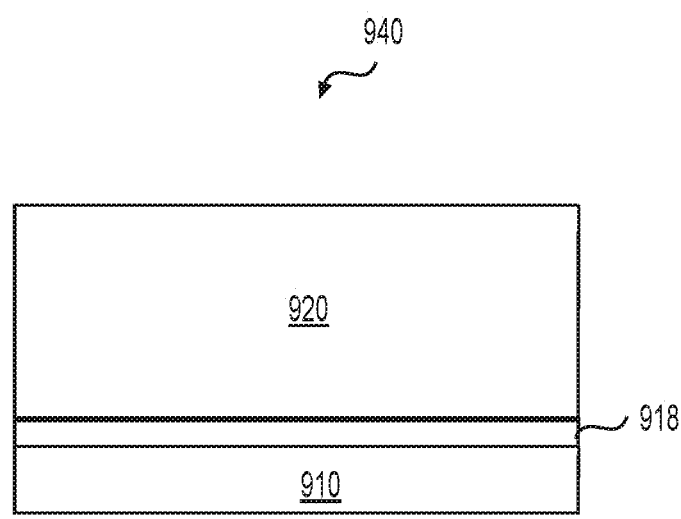
FIGS. 9-12 are cross-sectional views of a portion of various semiconductor structures at various steps of the process according to some embodiments of the disclosure

The weight W of the removed top portion of the sacrificial layer 310 when forming the recessed region 610 can be obtained from a pre-determined weight. FIG. 8 shows a flow chart outlining a process 800 for determining the pre-determined weight according to an embodiment of the disclosure. The process 800 starts at S801, and proceeds to S810. Referring to FIGS. 8 and 9, at S810, a fifth structure 940 including a sacrificial layer 920 is formed over a semiconductor substrate 910. The semiconductor substrate 910 can have similar or identical materials, dimensions, and structure as those of the substrate 201, thus, detailed description is omitted for purposes of clarity. A oxide layer 918 similar or identical to that of the oxide layer 218 can be formed by an oxidation process over the substrate 910. The sacrificial layer 920 can have similar or identical materials, dimensions, and structure as those of second portion 310b of the sacrificial layer 310, thus, detailed description is omitted for purposes of clarity. Further, the sacrificial layer 920 can be formed using any suitable process, such as an ALD process, a CVD process, a PVD process, or a combination thereof. In an example, the sacrificial layer 920 is formed using the same material and the same/similar deposition process as those for the sacrificial layer 310. A thickness of the sacrificial layer 920 can be larger than 200 nm based on manufacturing requirements and/or processes.

Similar to step S120, at S820, a fifth weight associated with the fifth structure 940 is determined. For example, the fifth weight is determined by weighing a semiconductor wafer including the first structure 940.

Figure 10:
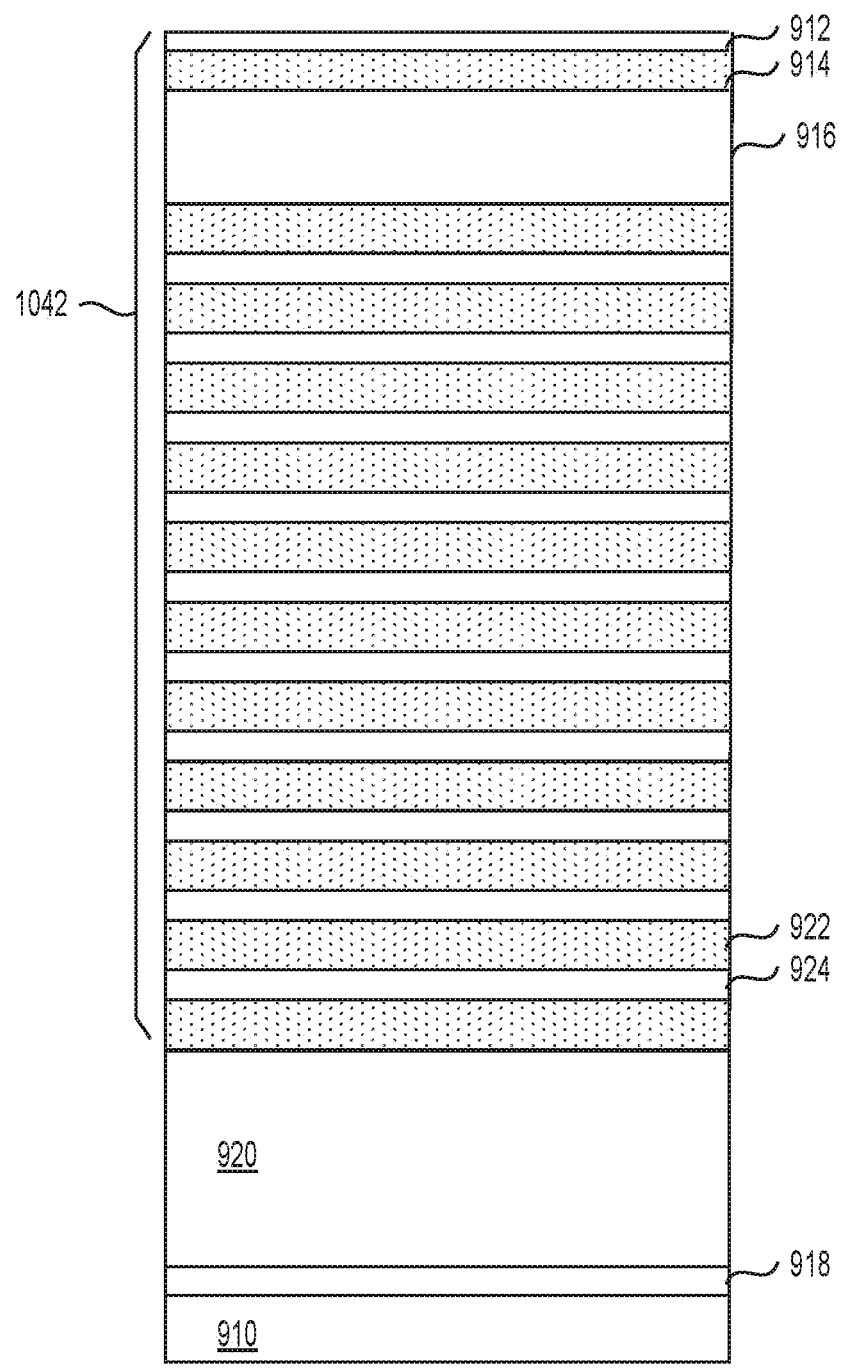

Referring to FIGS. 8 and 10, at S830, stacked insulating layers 1042 are formed above the fifth structure 940. In various embodiments, the stacked insulating layers 1042 are similar or identical to the second stacked insulating layers 542. For example, the stacked insulating layers 1042 include alternately formed first insulating layers 922 and second insulating layers 924. A number of the first insulating layers 922 is identical to the number of the first insulating layers 522. The first insulating layers 922 have similar or identical materials, dimensions, and manufacturing process as those of the first insulating layers 522, and the second insulating layers 924 have similar or identical materials, dimensions, and manufacturing process as those of the second insulating layers 524. Further, the stacked insulating layers 1042 include one or more additional insulating layers such as 916, 914, and 912 that are similar or identical to the one or more additional insulating layers such as 516, 514, and 512 in the second stacked insulating layers 542. In an example, the stacked insulating layers 1042 are identical to the second stacked insulating layers 542.

Figure 11:
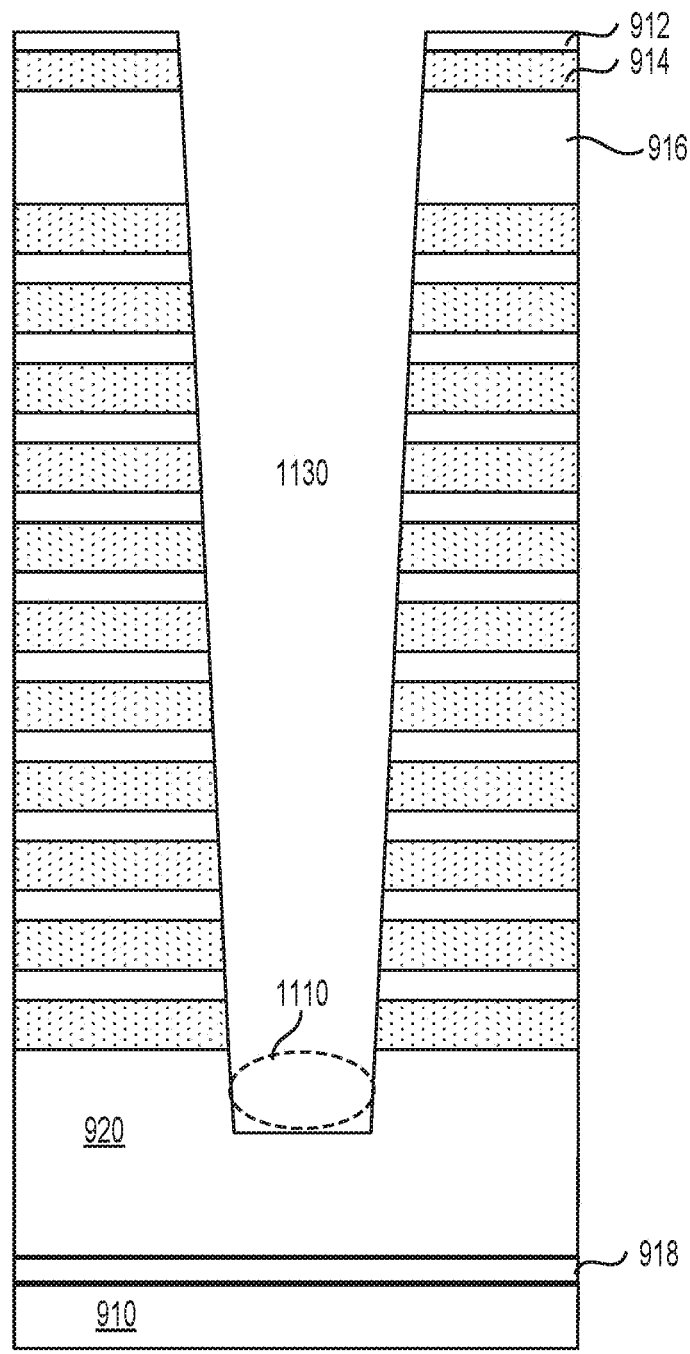

Referring to FIGS. 8 and 11, at S840, a via 1130 is formed into the fifth structure 940 by removing a first portion of the sacrificial layer 920 and a second portion of the stacked insulating layers 1042. Note that the via 1130 includes a recessed region 1110 formed by removing the first portion of the sacrificial layer 920. In various embodiments, S840 used to form the via 1130 is similar or identical to S170 used to form the opening 680. Accordingly, the via 1130 is similar or identical to the opening 680. In general, a weight $W_{pre}$ of the first portion removed from the sacrificial layer 920 corresponds to the weight W of the removed top portion of the sacrificial layer 310 when forming the recessed region 610. In an example, the stacked insulating layers 1042 are substantially identical to the second stacked insulating layers 542 and the same etching process used in S170 is used for S840, accordingly, the recessed region 1110 is substantially identical to the recessed region 610 in FIG. 6. Therefore, the weight $W_{pre}$ can be substantially identical to the weight W.

Figure 12:
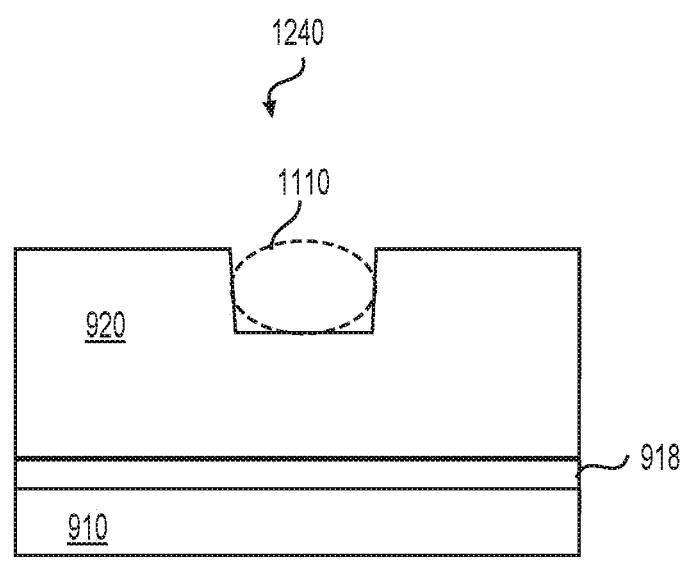

Referring to FIGS. 8 and 12, at S850, the stacked insulating layers 1042 are removed to form a sixth structure 1240. The stacked insulating layers 1042 can be removed using any suitable process, such as a dry etch, a wet etch, and a combination thereof. In an example, the stacked insulating layers 1042 are removed using a selective wet etching that removes the stacked insulating layers 1042 and minimally affects the sacrificial layer 920.

Similar to step S820, at S860, a sixth weight associated with the sixth structure 1240 is determined. For example, the sixth weight is determined by weighing the semiconductor wafer including the six structure 1240.

At S870, the weight $W_{pre}$ of the first portion removed from the sacrificial layer 920 is determined based on the fifth weight and the sixth weight. In an example, the weight $W_{pre}$ is the difference between the fifth weight W5 and the sixth weight W6, and $W_{pre}$=W5−W6. The process 800 proceeds to S899, and terminates.

The weight $W_{pre}$ is pre-determined using the process 800, thus, the weight $W_{pre}$ is also referred to as the pre-determined weight $W_{pre}$. As described above, the pre-determined weight $W_{pre}$ can be substantially identical to the weight W of the removed top portion of the sacrificial layer 310 when forming the recessed region 610. Therefore, when determining the quality of the extended via in S194 of the process 100, the weight W can be obtained based on the pre-determined weight $W_{pre}$. In an example, the weight W is equal to the pre-determined weight $W_{pre}$, i.e., $W=W_{pre}$. Accordingly, at S194, the quality of the extended via, such as the extended vias 730a-730c is determined based on the first to fourth weights and the pre-determined weight $W_{pre}$.

Note that the process 800 used to determine the pre-determined weight $W_{pre}$ can take longer time, such as one or a few hours, than the steps S120, S150, S180, and S192 where the first to fourth weights are determined, respectively. After the pre-determined weight $W_{pre}$ is determined, the pre-determined weight $W_{pre}$ can be saved in a memory that is accessible in the step S194, for example, by a processor that implements S194. Hence, the determination of the quality of the extended via using the steps S120, S150, S180, S192, and S194 can be implemented efficiently, for example, in about 10 seconds.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a first structure of first stacked insulating layers comprising a first via that is arranged over a contact region on a substrate and that extends through the first stacked insulating layers;
    forming a second structure by filling at least a top region of the first via with a sacrificial layer;
    forming a third structure comprising the second structure and second stacked insulating layers that are stacked above the second structure, the third structure further comprising a second via that is aligned with the first via and that extends through the second stacked insulating layers;
    forming a fourth structure by removing the sacrificial layer from the third structure to form an extended via that comprises the first via and the second via;
    determining a plurality of weights associated with the first structure, the second structure, the third structure, and the fourth structure; and
    determining a quality of the extended via based on the plurality of weights.

2. The method of claim 1, wherein
    forming the third structure further comprises forming a recessed region in the sacrificial layer by removing a top portion from the sacrificial layer; and
    the method further comprising:
        obtaining a weight of the removed top portion of the sacrificial layer; and
        determining the quality of the extended via further based on the plurality of weights and the weight of the removed top portion of the sacrificial layer.

3. The method of claim 2, wherein the first recessed region is formed above the sacrificial layer.

4. The method of claim 1, wherein determining the quality of the extended via comprises:
    determining whether any of the sacrificial layer remains in the extended via and/or whether any of the contact region was removed.

5. The method of claim 4, further comprising:
    determining whether any of the substrate was removed.

6. The method of claim 2, wherein the plurality of weights comprises a first weight, a second weight, a third weight, and a fourth weight corresponding to the first structure, the second structure, the third structure, and the fourth structure, respectively, and determining the quality of the extended via comprises:
    determining, based on the first weight and the second weight, a first weight difference corresponding to a weight of the sacrificial layer in the first via of the second structure;
    determining, based on the third weight, the fourth weight, and the weight of the removed top portion of the sacrificial layer, a second weight difference corresponding to a sum of a weight of the sacrificial layer removed from the first via and a weight of a portion removed from at least the contact region; and
    determining the quality of the extended via based on the first weight difference and the second weight difference.

7. The method of claim 6, wherein determining the quality of the extended via based on the first weight difference and the second weight difference comprises:
    when the first weight difference and the second weight difference satisfy a pre-defined first condition, the extended via is determined not to comprise the sacrificial layer and the portion of at least the contact region is not removed;
    when the first weight difference and the second weight difference satisfy a pre-defined second condition, the extended via is determined to comprise a portion of the sacrificial layer; and
    when the first weight difference and the second weight difference satisfy a pre-defined third condition, the portion of at least the contact region is determined to be removed.

8. The method of claim 1, wherein forming the second structure comprises:
    filling at least the top region of the first via with the sacrificial layer, a top surface of the sacrificial layer being coplanar with a top surface of the first structure.

9. The method of claim 2, further comprising:
    forming a fifth structure that comprises another sacrificial layer above another semiconductor substrate;
    forming another stacked insulating layers over the fifth structure, the other stacked insulating layers corresponding to the second stacked insulating layers;
    forming another via extending through the other stacked insulating layers and into the other sacrificial layer by removing a portion of the other stacked insulating layers and a portion of the other sacrificial layer;
    removing the other stacked insulating layers to form a sixth structure;
    determining a fifth weight of the fifth structure and a sixth weight of the sixth structure, respectively; and
    determining a weight of the removed portion from the other sacrificial layer based on the fifth weight and the sixth weight.

10. The method of claim 9, wherein obtaining the weight of the removed top portion of the sacrificial layer comprises:
    obtaining the weight of the removed top portion of the sacrificial layer in the third structure based on the weight of the removed portion from the other sacrificial layer.

11. The method of claim 10, wherein the weight of the removed top portion of the sacrificial layer in the third structure is identical to the weight of the removed portion from the other sacrificial layer.

12. The method of claim 1, wherein the first stacked insulating layers comprise alternately formed first insulating layers and second insulating layers that have different etch rate.

13. The method of claim 12, wherein the first insulating layers comprise silicon oxide and the second insulating layers comprise silicon nitride.

14. The method of claim 1, wherein the sacrificial layer comprises polysilicon.

15. The method of claim 1, wherein the contact region comprises monocrystalline silicon formed by selective epitaxy growth.

16. The method of claim 12, wherein the first stacked insulating layers further comprise one or more insulating layers between the substrate and a lowermost layer of the first insulating layers and the second insulating layers.

17. The method of claim 2, wherein the plurality of weights comprises a first weight, a second weight, a third weight, and a fourth weight corresponding to the first structure, the second structure, the third structure, and the fourth structure, respectively, and determining the quality of the extended via comprises:

determining a quality indicator based on the first to fourth weights and the weight of the removed top portion of the sacrificial layer, the quality indicator indicating a difference between a weight of the sacrificial layer in the first via of the second structure and a combined weight that is a sum of a weight of the sacrificial layer removed from the first via and a weight of a portion removed from at least the contact region; and determining the quality of the extended via based on the quality indicator.

18. A method, comprising:

forming a first structure that comprises a sacrificial layer above a semiconductor substrate;

forming a stack of insulating layers over the first structure;

forming a via extending through the stack of insulating layers and into the sacrificial layer by removing a portion of the stack and a portion of the sacrificial layer;

removing the stack of insulating layers to form a second structure;

determining a first weight of the first structure and a second weight of the second structure, respectively; and determining a weight of the removed portion from the sacrificial layer based on the first weight and the second weight.

19. The method of claim 18, wherein a thickness of the portion of the sacrificial layer is less than a thickness of the sacrificial layer.

20. The method of claim 18, wherein removing the stack to form the second structure comprises:

removing the stack selectively to avoid removal of the sacrificial layer.

* * * * *